United States Patent
Bilotti et al.

(10) Patent No.: US 6,995,606 B2
(45) Date of Patent: Feb. 7, 2006

(54) HIGH PASS FILTER USING INSULATED GATE FIELD EFFECT TRANSISTORS

(75) Inventors: Alberto Bilotti, Buenos Aires (AR); Hernan D. Romero, Buenos Aires (AR)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 10/855,101

(22) Filed: May 27, 2004

(65) Prior Publication Data

US 2005/0264348 A1 Dec. 1, 2005

(51) Int. Cl.
 H03K 5/00 (2006.01)
(52) U.S. Cl. .................. 327/553; 327/552; 327/559
(58) Field of Classification Search ......... 327/552–559
 See application file for complete search history.

(56) References Cited

U.S. PATENT DOCUMENTS

| | | | | |
|---|---|---|---|---|
| 4,509,019 A | * | 4/1985 | Banu et al. | 330/107 |
| 4,751,455 A | | 6/1988 | Ayres | |
| 5,300,896 A | * | 4/1994 | Suesserman | 330/260 |
| 5,994,966 A | | 11/1999 | Stikvoort | |
| 6,169,764 B1 | * | 1/2001 | Babanezhad | 375/233 |
| 2003/0095061 A1 | | 5/2003 | Tokioka | |
| 2004/0169532 A1 | | 9/2004 | Kim | |
| 2004/0217806 A1 | * | 11/2004 | Kasperkovitz | 327/552 |
| 2004/0263211 A1 | | 12/2004 | Kang | |

FOREIGN PATENT DOCUMENTS

| | | |
|---|---|---|
| DE | 103 31 571 A1 | 2/2005 |
| EP | 0 220 043 A2 | 4/1987 |
| EP | 0 467 653 A1 | 1/1992 |
| EP | 1 003 155 A1 | 5/2000 |
| WO | WO 2004/107557 A1 | 12/2004 |

OTHER PUBLICATIONS

Wyszynski et al., "Frequency and Phase Tuning of Continuos-Time Intergrated Filters Using Common-Mode Signals", Circuits and Systems, 1994, ISCAS 1994, IEEE International Symposium on London, May 2, 1994, vol. 5, pp. 269-272.
PCT Search Report and Written Opinion of the ISA for PCT/US2005/007251 dated Jun. 15, 2005.

* cited by examiner

*Primary Examiner*—Dinh T. Le
(74) *Attorney, Agent, or Firm*—Daly, Crowley, Mofford & Durkee,LLP

(57) ABSTRACT

A high pass filter comprising a combination of capacitors and insulated gate field effect transistors (IGFETs) used as effective resistors provides a low break frequency, while providing improved linearity and a stable break frequency over a relatively wide range of input voltages. The high pass filter can be realized with a small physical size. In one particular embodiment, the small physical size allows the capacitors and the IGFET devices to be integrated together onto a common substrate.

19 Claims, 4 Drawing Sheets

HIGH PASS FILTER USING INSULATED GATE FIELD EFFECT TRANSISTORS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic filters and, more particularly, to electronic high pass filters having very low cutoff frequencies.

BACKGROUND OF THE INVENTION

As is known to those of ordinary skill in the art, a simple form of a one-pole high pass analog filter includes a capacitor and a resistor, wherein the values of the capacitor and resistor determine a cutoff frequency (also referred to herein as a break frequency or a −3 dB point). In order to obtain a very low break frequency, for example, on the order of a few Hertz, the values of the capacitor and/or resistor must be relatively large, and the corresponding capacitor and/or resistor tend to be physically large. Being physically large, it is generally not practical to integrate the capacitor and resistor onto a common substrate, such as a silicon substrate.

As is also known, an insulated gate field effect transistor (IGFET), which is relatively small and which can be fabricated on a substrate, can be used to provide a relatively high value effective resistance, on the order of hundreds of Megohms. The high resistance IGFET device can be used as the resistor in a high pass filter. Because the effective resistance of the IGFET device can be quite large, the IGFET device is suitable for use in a high pass filter having a low break frequency.

Because an IGFET device, or simply IGFET, has a resistance that is non-linear in parts of its operating voltage range, a variety of techniques have been developed to provide linear operation, i.e., reduced distortion, of a high pass filter using the IGFET device.

Referring to FIG. 1, a prior art integrator circuit 10 uses IGFET devices 12, 14 and capacitors 16, 18 coupled in a differential arrangement about an operational amplifier 20. While a complete high pass filter is not shown, one of ordinary skill in the art will understand that a high-pass filter can be implemented by means of an integrator, where the integrator uses resistors and capacitors. The integrator circuit 10 uses of IGFET devices as equivalent resistors. The IGFET device 12 in combination with the capacitor 16 provides a first integrator portion and the IGFET device 14 in combination with the capacitor 18 provides a second integrator portion, which together provide an integrator transfer function between input terminals 22a, 22b and output terminals 24a, 24b.

As is known, the value of a drain-source voltage, $V_{DS}$, applied between a drain and a source of an IGFET device tends to affect its resistance in proportion to the value. An AC input voltage, Vin, applied as opposing phase signals, +Vin/2, −Vin/2, to the input terminals 22a, 22b provides opposing voltages at the source 12a of the IGFET device 12 and the source 12b of IGFET device 14, and therefore, drain-source voltages moving in opposite directions at each of the two IGFET devices 12, 14. It will be understood by one of ordinary skill in the art that the opposing voltages applied to the sources of the IGFET devices 12, 14 tend to result in opposite changes in effective resistance of the IGFET devices 12, 14 as the input AC voltage, Vin, changes in each cycle. These canceling effects occur when the input voltage, Vin, is sufficiently small so as to keep an operating point of the IGFET device 12, 14 within a parabolic range, which is further described in conjunction with FIG. 3. Therefore, when the input voltage, Vin, is relatively small, the integrator 10 provides a substantially linear transfer function or response between the input terminals 22a, 22b and the output terminals 24a, 24b.

However, as is known, larger input amplitudes of the input voltage, Vin, enlarge the operating range of the IGFET devices 12, 14 into a saturation region, which is also further described in conjunction with FIG. 3. Therefore, when the input voltage, Vin, is relatively large, the above-mentioned canceling effects are reduced and the integrator circuit 10 generates distortion at the output terminals 24a and 24b. In order to compensate for the non-linearities resulting from large input signals, complex circuitry (not shown) is required.

SUMMARY OF THE INVENTION

The present invention provides a high pass filter comprising a combination of capacitors and insulated gate field effect transistors (IGFETs) used as effective resistors. The high pass filter circuit provides a low frequency −3 dB point, for example, of a few Hertz, while providing improved linearity in the filter pass-band and small physical size.

The high pass filter of the present invention includes a differential arrangement of two RC high pass filter portions, each having a capacitor and an IGFET device with high effective resistance. For relatively large input voltages, the IGFET devices operate in a saturation range, causing each RC high-pass filter portion to generate a DC shifted voltage at its output, resulting in reduced distortion from each high pass filter portion. The DC shifted voltages generated by each of the RC high pass filter portions are substantially equal, and therefore, tend to cancel due to the differential arrangement. In one particular embodiment, shifts in break frequency of the high pass filter caused by the DC shifted voltages are compensated by means of a feedback arrangement that senses the DC shifted voltages of the RC high pass filter portions, and controls gate voltages applied to the IGFET devices accordingly.

In accordance with the present invention, a high pass filter circuit includes first and second input terminals at which a differential input voltage is applied and first and second output terminals at which a differential output voltage is provided. A first high pass filter portion of the high pass filter circuit includes a first capacitor having first and second terminals, wherein the first terminal of the first capacitor is coupled to the first input terminal, and a first IGFET device having a source, a drain, and a gate, wherein the drain of the first IGFET device is couple to the second terminal of the first capacitor. The source of the first IGFET device is coupled to a bias voltage. A second high pass filter portion of the high pass filter circuit includes a second capacitor having first and second terminals, wherein the first terminal of the second capacitor is coupled to the second input terminal, and a second IGFET device having a source, a drain, and a gate, wherein the drain of the second IGFET device is coupled to the second terminal of the second capacitor. The source of the second IGFET device is also coupled to the bias voltage.

In accordance with another aspect of the present invention, a high pass filter includes a first RC filter portion comprising a first capacitor and an effective resistance of a first IGFET device, and a second RC filter portion comprising a second capacitor and an effective resistance of a second IGFET device coupled in series with the first IGFET device. An input voltage to the filter is applied differentially to the first and second capacitors. A bias voltage is coupled to the first and second IGFET devices.

With these particular arrangements, a high pass filter is provided, which can generate a relatively low frequency break frequency with low distortion, and which is composed of relatively small electrical components.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the high pass filter of the present inventions, some introductory concepts and terminology are explained. As used herein, the terms "cutoff frequency," "break frequency," and "−3 dB point" are used synonymously to describe a frequency on a one-pole filter transfer function curve at which the filter provides a signal amplitude reduction of 3 dB. Also, as used herein, the term "low frequency" applies to frequencies below about one hundred Hertz. As used herein, the term "insulated gate field effect transistor" (IGFET), can refer to an insulated gate field effect transistor (FET) fabricated on one of a variety of substrates, including, but not limited to a silicon substrate, a gallium arsenide (GaAs) substrate, and a sapphire substrate. It will be recognized that, when fabricated on a silicon substrate, the IGFET is also commonly referred to as a metal oxide silicon (MOS) transistor.

Figure 2:
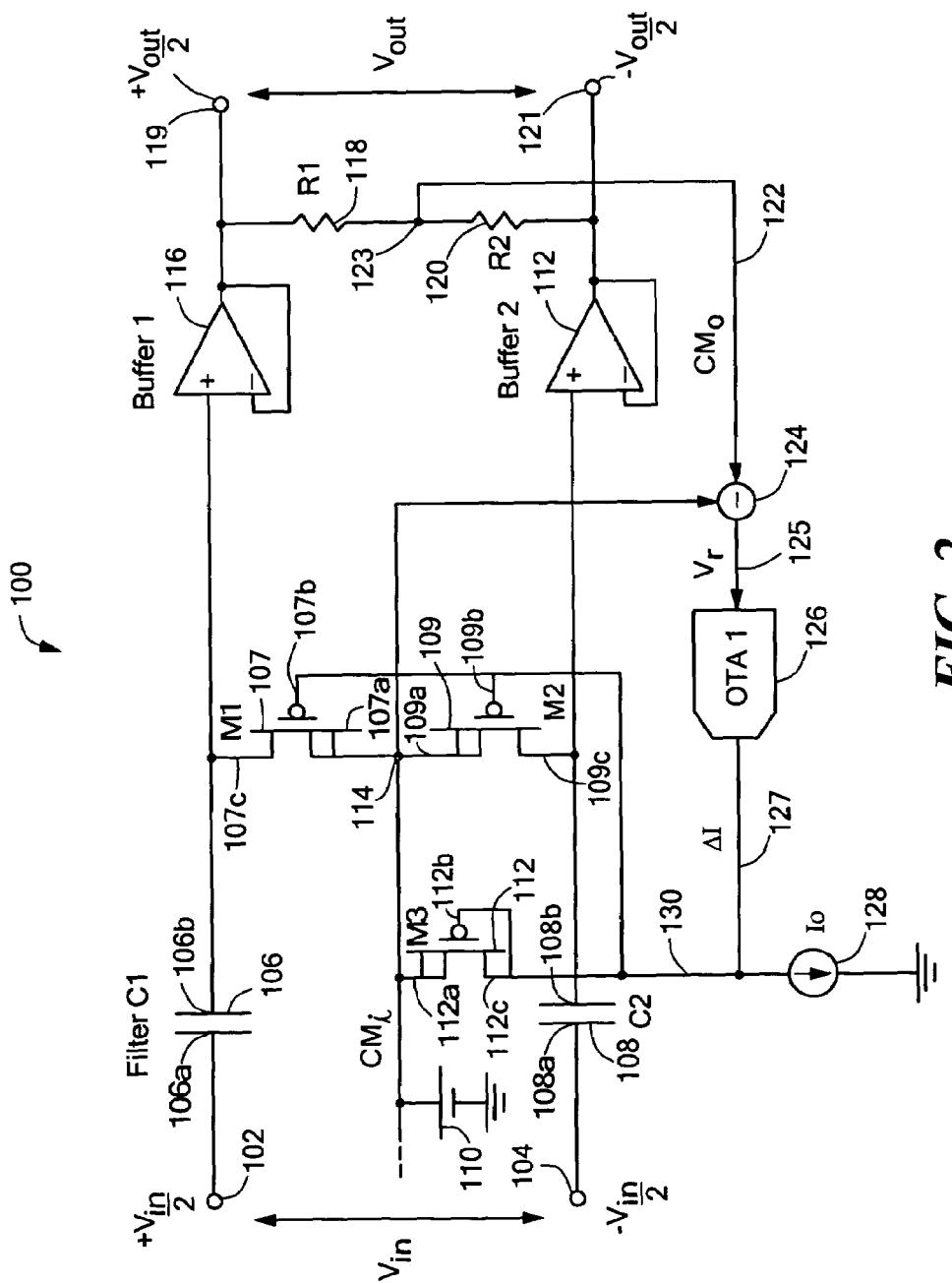
FIG. 2 is a schematic diagram of a high pass filter circuit in accordance with the present invention, which includes capacitors and IGFETs.

Referring now to FIG. 2, a high pass filter circuit 100 according to the invention includes first and second input terminals 102, 104, respectively, for receiving a differential input voltage, Vin. A first high pass filter portion includes a first capacitor 106 having first and second terminals 106a, 106b, respectively. The first terminal 106a of the first capacitor 106 is coupled to the first input terminal 102. The first high pass filter portion also includes a first IGFET device 107 having a source, drain, and gate, 107a, 107b, 107c, respectively. The source 107a of the first IGFET device 107 is coupled to a bias voltage node 114 having a bias voltage provided, for example, by a voltage source 110.

A second high pass filter portion includes a second capacitor 108 having first and second terminals 108a, 108b, respectively. The first terminal 108a of the second capacitor 108 is coupled to the second input terminal 104. The second high pass filter portion also includes a second IGFET device 109 having a source, drain, and gate, 109a, 109b, 109c, respectively. The source 109a of the second IGFET device 108 is coupled to the bias voltage node 114.

A first buffer stage 116 is coupled between the second terminal 106b of the first capacitor 106 and a first output terminal 119. A second buffer stage 112 is coupled between the second terminal 108b of the second capacitor 108 and a second output terminal 121.

First and second resistors 118, 120, respectively, are coupled in a series arrangement between the first output terminal 119 and the second output terminal 121 forming a junction node 123. In one particular embodiment, the resistors 118, 120 are equal in value. A differencing circuit 124 is coupled to the junction node 123 and to the bias voltage node 114 to provide a voltage difference signal 125 responsive to a difference between a voltage at the junction node 123 and a voltage at the bias voltage node 114.

A third IGFET device 112 having a source, a drain, and a gate 112a, 112b, 112c, respectively, is coupled to the bias voltage node 114 and to the gates 107b, 109b of the first and second IGFET devices 107, 109, respectively. The drain 112c and the gate 112b of the third IGFET device 112 are coupled together forming a diode-connected IGFET between the source 112a and the drain 112c. A current source 128 provides a constant current portion, $I_0$, through the third IGFET device 112.

A transconductance amplifier 126 provides a current control signal 127 including a controlled current portion, $\Delta I$, proportional to the voltage difference signal 125 to generate a total current having the constant current portion, $I_0$, and the controlled current portion, $\Delta I$, both flowing through the third IGFET device 112. The third IGFET device 112, operating as a diode, provides a control voltage signal 130 to the gates 107b, 109b of the first and second IGFET devices 107, 109, respectively, thereby controlling the effective resistance of the first and second IGFET devices 107, 109. Controlling the effective resistance of the IGFET devices 107, 109 provides control of the break frequency of the high pass filter 100. The control of the effective resistance of the first and second IGFET devices 107, 109 by way of gate voltage control is described more fully below in conjunction with FIG. 3.

It will be recognized that the effective resistance of the IGFET devices 107, 109 is a highly sensitive function of voltage applied to the gates 107b, 109b of the IGFET devices 107, 109, i.e., the control voltage signal 130. Therefore, in order to achieve a fine control of the voltage appearing at the gates 107b, 109b, as described above, the third IGFET device 112 is coupled as a diode, which is known to change forward voltage by only a small amount over a wide range of current. Therefore, the current control signal 127 provides the controlled current, $\Delta I$, through the third IGFET device 112 resulting in fine control of the control voltage signal 130.

In operation, the input voltage appearing at the first terminal 106a of the first capacitor 106 has an AC component, +Vin/2, and the input voltage appearing at the first terminal 108a of the second capacitor 108 has an AC component, −Vin/2, where Vin is an input differential AC voltage. For relatively small input signals having a relatively small AC component, the voltages appearing on the second terminals 106b, 108b of the first and second capacitors 106, 108, respectively (also on the drains 107c, 109c of the first and second IGFET devices 107, 109, respectively), have a DC component, which is a common mode voltage equal to the voltage appearing at the bias voltage node 114. In one particular embodiment, the voltage at the bias voltage note 114 is a selected voltage between one and three volts, thereby providing the selected voltage at the drains 107c, 109c of the first and second IGFET devices 107, 109, respectively, and providing a linear relationship between the input voltage, Vin, and output differential voltage, Vout. However, for larger input signals having a relatively large AC component, the voltages appearing on the second terminals 106b, 108b of the first and second capacitors 106, 108, respectively, have equal DC components that are shifted in a negative voltage direction below the voltage appearing at the bias voltage node 114. This effect, due to a rectification within the high-pass filter, will be better understood from the discussion in conjunction with FIGS. 3 and 4 below.

The shift in the DC component associated with larger input signals described above has the effect of shifting a drain-source voltage ($V_{DS}$) operating voltage range of the first and second IGFET devices 107, 109, respectively, causing the first and second IGFET devices 107, 109, respectively, to operate in a more linear $V_{DS}$ operating region. Therefore, signals appearing on the second terminals 106b, 108b of the first and second capacitors 106, 108, respectively, and resulting output signals appearing at the first and second output terminals 119, 121, respectively, remain substantially linear. In effect, the shift in the output DC level enabled by the first and second capacitors 106, 108 tends to automatically linearize operation in the pass-band of the high pass filter circuit 100 in the presence of relatively high input signals, without need of special linearizing circuitry.

The shift in the output DC component associated with larger input signals described above also causes the cutoff frequency of the high pass filter circuit 10 to shift in relation to the amount of the DC shift. This effect will also be better understood from the discussion in conjunction with FIGS. 3 and 4 below.

In operation, a voltage appearing at the junction node 123 includes a DC voltage having a magnitude substantially equal to a sum of the above-described DC voltage level shift appearing at the second terminals 106b, 108b of the first and second capacitors 106, 108, respectively, and the bias voltage at node 114. The voltage difference signal 125 and the current control signal 127 are, therefore, proportional to the amount of the above-described DC voltage level shift. Therefore, as further described below in conjunction with FIG. 3, a larger input signal, Vin, resulting in a larger DC voltage shift, results in a larger current control signal 127, a higher control voltage signal 130, and a lower effective resistance associated with the first and second IGFET devices 107, 109, respectively. The lower effective resistance corresponds to a higher cutoff frequency. With this particular arrangement, while the cutoff frequency of the high pass filter circuit 10 would otherwise tend to become lower as the amplitude of the input signal, Vin, increases, the shift in cutoff frequency is compensated by a corresponding increase of the control voltage signal 130. The control voltage signal 130 operates to influence the effective resistance of the IGFET devices 107, 109, keeping the cutoff frequency substantially constant regardless of whether the input signal, Vin, appearing at the input terminals 102, 104 is relatively small or relatively large.

For the reasons discussed above, the high pass filter 100, although operating with IGFETs of large resistance values, provides linear operation over a relatively wide range of input voltages, Vin. Also for the reasons discussed above, the high pass filter 100 provides control of the cutoff frequency. Furthermore, the IGFET devices 107, 109 are sufficiently small that they can be fabricated on one of a variety of substrates, including but not limited to, a silicon substrate, a gallium arsenide (GaAs) substrate, and a sapphire substrate. And, because the effective resistance of the IGFET devices 107, 109 is relatively high, the capacitors 106, 108 can have a relatively small value and corresponding small physical size, allowing the capacitors 106, 108 to be fabricated with the IGFET devices 107, 109 (and other circuitry) on a common substrate using integrated circuit fabrication techniques. In one particular embodiment, the common substrate is a silicon substrate.

In one particular embodiment, the first and second capacitors 106, 108 each have a value of about one hundred fifty PicoFarads, the first, second, and third IGFET devices 107, 109, 112 are P-channel IGFET devices, a small signal cutoff frequency is about fifteen Hertz, a maximum input voltage, Vin, is about 1.5 volts peak-to-peak, and a resulting high pass filter circuit provides a maximum output distortion in the filter pass-band of about −35 dB at fifteen Hertz and about −55 dB at frequencies greater than about eighty Hertz.

In yet another embodiment, a high pass filter (not shown) having desirable characteristics can include only the first and second capacitors 106, 108 and the first and second IGFET devices 107, 109, without circuitry to generate the control voltage signal 130.

While the IGFET devices 107, 109, 112 are shown to be P-channel IGFET devices, in yet another embodiment, the IGFET devices 107, 109, and 112 are N-Channel IGFET devices. It will be understood that, when using N-channel IGFET devices, a different DC biasing arrangement must be used.

While the high pass filter circuit 100 is a single pole high pass filter, it will be appreciated that higher order filters can be achieved with the above-described circuit structures. For example, in one particular embodiment, two or more high pass filters 100 are arranged in series.

Figure 3A:
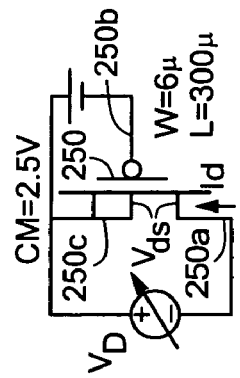
FIG. 3A is an exemplary circuit having a P-channel IGFET, which is associated with the response characteristic of FIG. 3.
Figure 3:
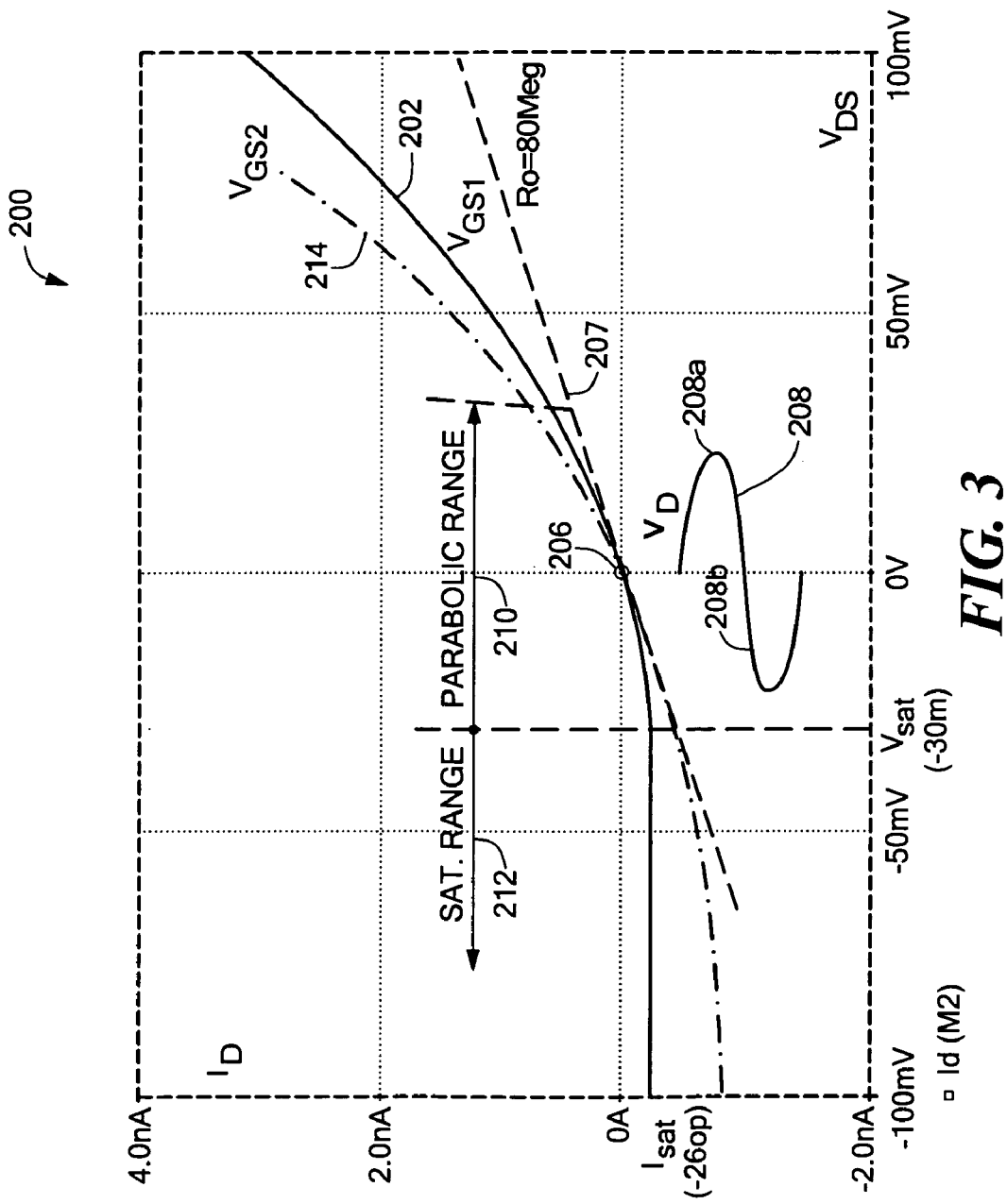
FIG. 3 is a graph showing an exemplary current-voltage (I/V) response characteristic of a P-channel IGFET.

Referring now to FIGS. 3 and 3A, a graph 200 associated with a typical P-channel IGFET device 250 (FIG. 3A) has a vertical scale corresponding to drain current, $I_D$, (FIG. 3A) and a horizontal scale corresponding to drain-source voltage, $V_{DS}$ (FIG. 3A), i.e., a voltage appearing between a drain 250a and a source 250c of the IGFET device 250. An IGFET device characteristic curve 202 corresponds to characteristics of the IGFET device 250 having a gate width, W, of six microns and a gate length, L, of three hundred microns, at a gate-source voltage having a first value, $V_{GS1}$. As is known, a slope of the curve 202 at a selected point on the curve 202 corresponds to an effective resistance of the IGFET device 250 when operating at a drain-source voltage near the selected point. For example, a point 206 corresponds to a drain-source voltage of zero volts and an effective resistance of about eighty Megohms as indicated by a slope of a line 207 tangential to the point 206. When operating at points to the left of the point 206, the effective resistance of the IGFET device 250 is higher and when operating at points to the right of the point 206, the effective resistance is lower.

Figure 1:
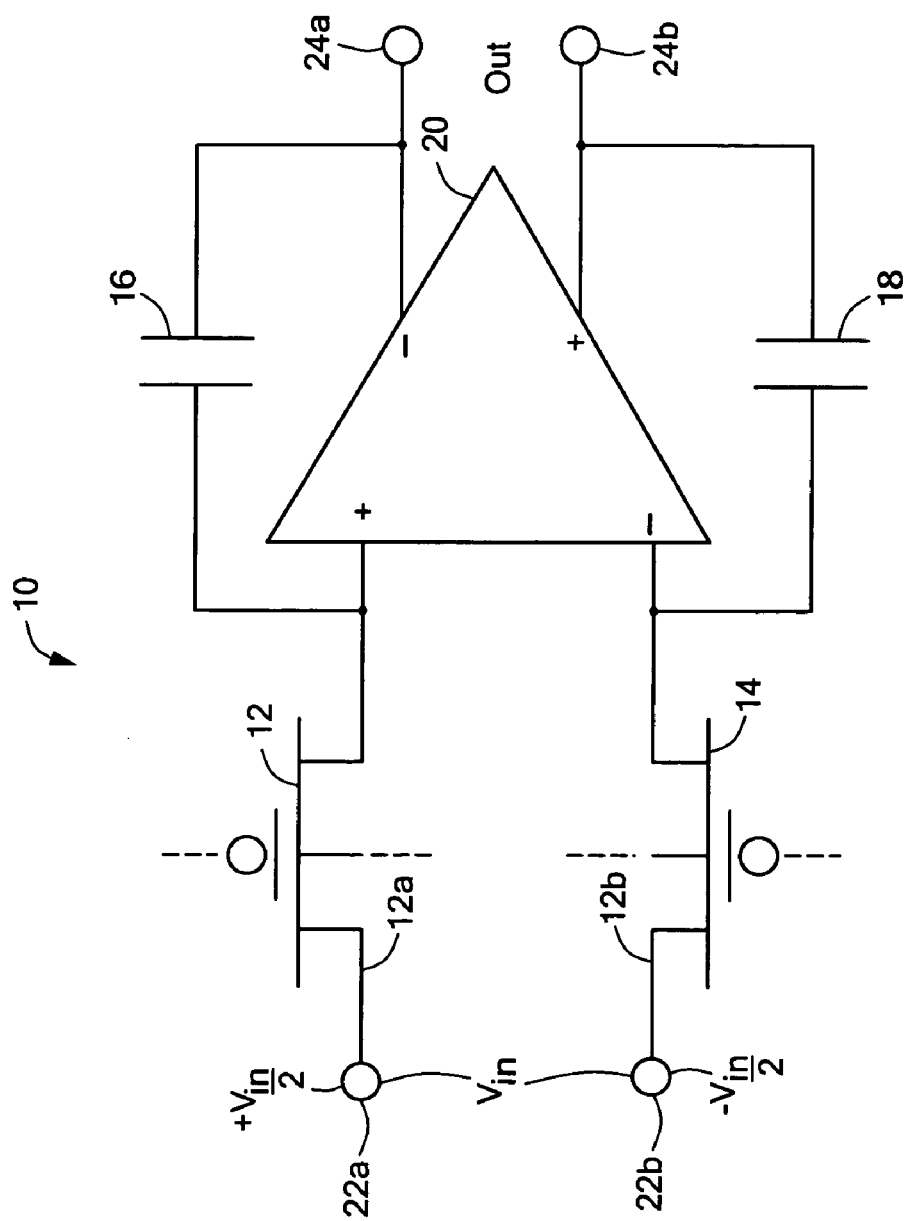
FIG. 1 is a schematic diagram of a prior art integrator circuit, which includes capacitors and insulated gate field effect transistors (IGFETs) arranged in a differential configuration.

Sinusoidal voltage curve 208 is representative of a relatively small input voltage appearing across the drain 250a and source 250c of the IGFET device 250, and is also representative, for example, of the relatively small voltage appearing across the drains 107a, 109a and the sources 107c, 109c of the first and second IGFET devices 107, 109, respectively, of FIG. 2. When the drain-source voltage is relatively small, the IGFET device 250 operates in a parabolic range 210. As described above in conjunction with FIG. 1, non-linearity generated by the changing effective resistance can be compensated with a differential arrangement.

For relatively small AC input voltages applied at a drain-source voltage near the operating point 206 where $V_{DS}=0$, the drain-source voltage remains within the parabolic region 210 and the small signal effective resistance, $R_0$, is given approximately by a relationship:

$$R_0 = [(W/L)K_p(V_G - V_t)]^{-1} \quad (1)$$

where W is the width of the gate 250b of the IGFET device 250, L is the length of the gate 250b of the IGFET device 250, $K_p$ is the current factor given by the product of gate capacitance and mobility, $V_G$ is gate voltage, and $V_t$ is the threshold voltage. It should be recognized that $(V_G - V_t)$ is an effective gate voltage, which corresponds to a drain saturation voltage, Vsat, shown, for example, in FIG. 3.

In one particular embodiment, $R_0$ is greater than one hundred Megohms, W/L is approximately 0.02, and Vsat is approximately minus thirty millivolts as shown in FIG. 3. For these values, and in general, it can be understood that the effective resistance, $R_0$, is very sensitive to gate voltage, $V_G$.

As described in conjunction with FIG. 2, in order to provide reduction of the sensitivity to the gate voltage, $V_G$, the third IGFET device 112 (FIG. 2) is provided in the diode-connected configuration to provide the finely controlled control voltage signal 130. With this particular arrangement, the effective resistance, $R_0$, is approximately:

$$R_0 = \frac{(W_2/L_2)^{1/2}}{(W_1/L_1)(2K_p I_0)^{1/2}} \quad (2)$$

where $W_2$ and $L_2$ are gate width and length corresponding to the third IGFET device 112 (FIG. 2), $W_1$ and $L_1$ are gate width and length corresponding to the first and second IGFET devices 107, 109 (FIG. 2), and $I_0$ (FIG. 2) is a current through the third IGFET device 112. The small voltage $(V_G - V_t)$ appearing in equation (1) does not appear in equation (2) above and the high pass filter 100, therefore, has reduced sensitivity to gate voltage appearing on the IGFET devices 107, 109.

In general, $W_1$ and $L_1$ are selected to minimize the ratio $W_1/L_1$ in accordance with a desired effective resistance $R_0$, while maintaining values that are in accordance with manufacturing limits. A value of Kp is determined primarily by manufacturing processes. The ratio $W_2/L_2$ is selected in order to achieve a reasonable value of $I_0$, for example a value near 1.0 μA. In one particular embodiment, $L_1$=300 μm, $W_1$=4 μm, $L_2$=4 μm, $W_2$=70 μm, and $I_0$=approximately 0.5 μA, resulting in a nominal effective resistance, $R_0$, of approximately 70 Megohms.

As described above in conjunction with FIG. 2, the voltage appearing on the drain of the first and second IGFET devices 107, 109 has a DC voltage shift in the negative voltage direction, causing the first and second IGFET devices 107, 108 to shift operating points to the left on the curve 202, into the saturation range 212. Operation in the saturation range 212 of the curve 202, which is a substantially linear region, provides improved linear operation, resulting in lower distortion. Operation in the saturation range 212 also provides a higher effective resistance, causing a shift in cutoff frequency downward in frequency.

Another transistor characteristic curve 214 shows a relationship between drain current and drain-source voltage that occurs when the gate-source voltage is changed to a second value, $V_{GS2}$, higher than the first value, $V_{GS1}$, as provided, for example, by the control voltage signal 130 of FIG. 2. It can be seen that, at all operating drain-source voltages, the effective resistance decreases (i.e., the slope increases), as compared to the transistor characteristic curve 202. Therefore, when an IGFET device is used in a high pass filter, for example the high pass filter 100 of FIG. 2, the cutoff frequency can be controlled, for example, by the control voltage signal 130 (FIG. 2). In this way, the control voltage signal 130, and therefore by the current control signal 127 (FIG. 2), can compensate for the downward shift of cutoff frequency of the high pass filter 100 resulting from the above-described DC level shift appearing at the second terminals 106b, 108b of the first and second capacitors in the presence of a relatively high input voltage amplitude.

Figure 4:
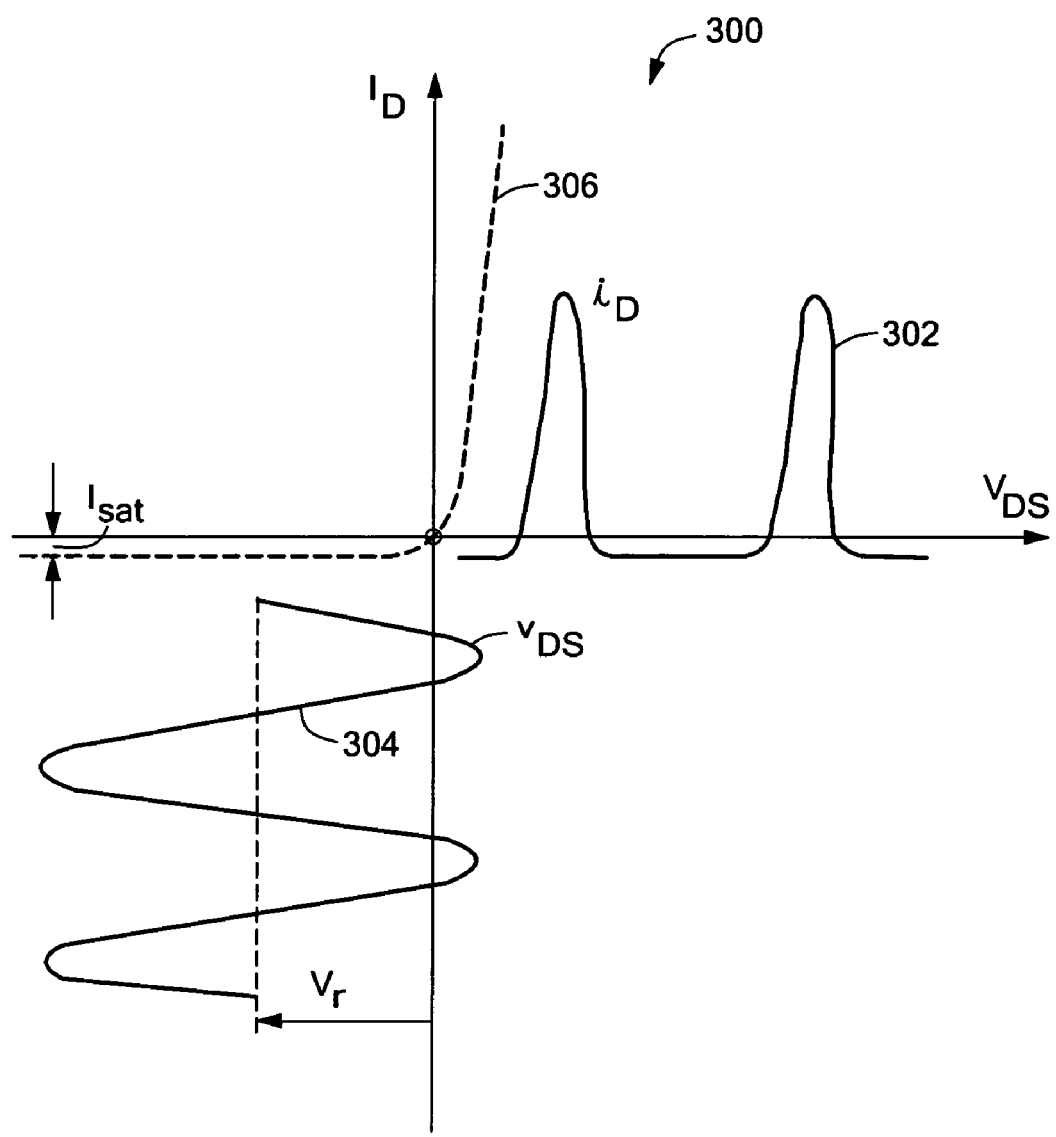
FIG. 4 is a graph showing current rectification and a corresponding voltage shift associated with an IGFET used as part of the circuit of FIG. 2.

Referring now to FIG. 4, a P-channel IGFET device characteristic curve 306 illustrates a diode-like characteristic. The IGFET device characteristic curve 306 can be the same as or similar to the transistor characteristic curve 202 of FIG. 3. When a drain-source voltage across an IGFET device, represented by a curve 304, becomes relatively large, drain current through the IGFET device becomes pulsed or rectified, as represented by a curve 302 and the IGFET characteristic approaches a diode-like characteristic.

Having a pulsed drain current in the presence of a relatively large input voltage, Vin, causes the first and second IGFET devices 107, 109 (FIG. 2) to provide the DC voltage shift at the drains 107c, 109c (FIG. 2) of the IGFET devices 107, 109, (FIG. 2) as described above. Therefore, the voltage appearing at the drains 107c, 109c of the first and second IGFET devices 107, 109 corresponding to the curve 304, shifts by an amount indicated as Vr, a negative voltage as shown.

Current pulses shown in the waveform 302, associated with the DC level shift for relatively large input voltages as described above, cause each of the IGFET devices, for example IGFET devices 107, 109 of FIG. 2, to operate mostly in a linear saturation range, for example, the saturation range 212 of FIG. 3.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A high pass filter circuit, comprising:
   first and second input terminals at which a differential input voltage is applied;
   first and second output terminals at which a differential output voltage is provided;
   a first high pass filter portion coupled between the first input terminal and the first output terminal, including a first capacitor having first and second terminals, the first terminal of the first capacitor coupled to the first input terminal, and a first IGFET device having a source, a drain, and a gate, the drain of the first IGFET device coupled to the second terminal of the first capacitor and the source of the first IGFET device coupled to a bias voltage;

a second high pass filter portion coupled between the second input terminal and the second output terminal, including a second capacitor having first and second terminals, the first terminal of the second capacitor coupled to the second input terminal, and a second IGFET device having a source, a drain, and a gate, the drain of the second IGFET device coupled to the second terminal of the second capacitor and the source of the second IGFET device coupled to the bias voltage; and a feedback circuit having a feedback circuit input terminal coupled to the first and second output terminals and having a feedback circuit output terminal coupled to the gate of the first IGFET and coupled to the gate of the second IGFET, wherein the feedback circuit is adapted to control a cutoff frequency of the high pass filter circuit.

2. The high pass filter circuit of claim 1, wherein the second terminal of the first capacitor is coupled to the first output terminal and the second terminal of the second capacitor is coupled to the second output terminal.

3. The high pass filter circuit of claim 1, further comprising
a first buffer stage coupled between the second terminal of the first capacitor and the first output terminal; and
a second buffer stage coupled between the second terminal of the second capacitor and the second output terminal, wherein the feedback circuit comprises:
a first resistor coupled between the first output terminal and a junction node;
a second resistor coupled between the second output terminal and the junction node;
a differencing circuit coupled to the junction node and to the bias voltage to provide a voltage difference signal;
a third IGFET device having a source, a drain, and a gate, the source of the third IGFET device coupled to the bias voltage node and the drain and the gate of the third IGFET device coupled together, the drain and the gate of the third IGFET device coupled to the gate of the first IGFET device and to the gate of the second IGFET device;
a current source coupled to the drain of the third IGFET device; and
a transconductance amplifier to receive the voltage difference signal and to provide a current control signal coupled to the drain of the third IGFET device and proportional to the voltage difference signal to control the cutoff frequency of the high pass filter circuit.

4. The high pass filter circuit of claim 3, wherein the first capacitor, the second capacitor, the first IGFET device, the second IGFET device, the first buffer stage, the second buffer stage, the differencing circuit, the third IGFET device, the current source, and the transconductance amplifier are provided on a common substrate.

5. The high pass filter circuit of claim 3, wherein the first capacitor, the second capacitor, the first IGFET device, and the second IGFET device are provided on a common substrate.

6. The high pass filter circuit of claim 1, wherein the first capacitor, the second capacitor, the first IGFET device, and the second IGFET device are provided on a common substrate.

7. The high pass filter circuit of claim 1, wherein a DC shifted replica of the differential input voltage is generated at the second terminal of the first capacitor and the second terminal of the second capacitor.

8. The high pass filter circuit of claim 1, wherein the differential input voltage results in a drain-source voltage on the first IGFET device and a drain-source voltage on the second IGFET device that causes the first and second IGFET devices to operate in a saturation region and in a parabolic region of drain-source voltage/current characteristics associated with the first and second IGFETs.

9. The high pass filter circuit of claim 1, wherein the feedback circuit is further adapted to control effective resistances of the first IGFET device and of the second IGFET.

10. The high pass filter circuit of claim 1, wherein the feedback circuit is further adapted to reduce a change in the cutoff frequency of the high pass filter circuit when operating within a predetermined amplitude range of the differential input voltage.

11. A high pass filter comprising:
first and second input terminals at which a differential input voltage is applied;
first and second output terminals at which a differential output voltage is provided;
a first RC filter portion coupled between the first input terminal and the first output terminal, comprising a first capacitor and an effective resistance of a first IGFET device;
a second RC filter portion coupled between the second input terminal and the second output terminal, comprising a second capacitor and an effective resistance of a second IGFET device coupled in series with the first IGFET device;
a bias voltage coupled to the first and second IGFET devices; and
a feedback circuit having a feedback circuit input terminal coupled to the first capacitor and coupled to the second capacitor and having a feedback circuit output terminal coupled to a gate of the first IGFET device and coupled to a gate of the second IGFET device, wherein the feedback circuit is adapted to control a cutoff frequency of the high pass filter.

12. The high pass filter of claim 11, wherein the input voltage results in a drain-source voltage on the first IGFET device and a drain-source voltage on the second IGFET device that causes the first and second IGFET devices to operate in a saturation region and in a parabolic region of drain-source voltage/current characteristics associated with the first and second IGFETs.

13. The high pass filter of claim 11, wherein the first and second capacitors and the first and second IGFET devices are integrated on a common substrate.

14. The high pass filter of claim 11, wherein the feedback circuit comprises a third, diode-connected IGFET device coupled to provide a control voltage signal to the gate of the first IGFET device and to the gate of the second IGFET device.

15. The high pass filter of claim 11, further comprising:
a first buffer stage coupled between the first capacitor and the first output terminal; and a second buffer stage coupled between the second capacitor and the second output terminal.

16. The high pass filter of claim 14, wherein the feedback circuit comprises:
- first and second resistors coupled in series between the first and second output terminals forming a junction node between the first and second resistors, wherein a bias node is formed between the series coupled first and second IGFET devices; and
- a subtractor having a first input terminal coupled to the junction node, a second input terminal coupled to the bias node, and an output terminal at which a difference voltage is provided.

17. The high pass filter of claim 16, wherein the feedback circuit further comprises a transconductance amplifier adapted to receive the difference voltage and to provide a controlled current proportional to the difference voltage, wherein the controlled current flows through the third IGFET device to adjust the control voltage signal.

18. The high pass filter of claim 11, wherein the feedback circuit is further adapted to control effective resistances of the first IGFET device and of the second IGFET.

19. The high pass filter of claim 11, wherein the feedback circuit is further adapted to reduce a change in the cutoff frequency of the high pass filter when operating within a predetermined amplitude range of the differential input voltage.

* * * * *

UNITED STATES PATENT AND TRADEMARK OFFICE
CERTIFICATE OF CORRECTION

PATENT NO. : 6,995,606 B2 Page 1 of 1
APPLICATION NO. : 10/855101
DATED : February 27, 2006
INVENTOR(S) : Alberto Bilotti et al.

It is certified that error appears in the above-identified patent and that said Letters Patent is hereby corrected as shown below:

Column 1, line 54 delete "uses of IGFET devices" and replace with --uses IGFET devices--.

Column 2, line 9 delete "IGFET device 12, 14" and replace with --IGFET devices 12, 14--.

Column 2, line 62 delete "is couple" and replace with --is coupled--.

Column 3, lines 44-45 delete "the present inventions," and replace with --the present invention,--.

Column 9, lines 27-28 delete "comprising" and replace with --comprising--.

Column 9, line 44 delete "bias voltage node and" and replace with --bias voltage and--.

Signed and Sealed this

Fifteenth Day of August, 2006

JON W. DUDAS
*Director of the United States Patent and Trademark Office*

UNITED STATES PATENT AND TRADEMARK OFFICE
CERTIFICATE OF CORRECTION

PATENT NO.       : 6,995,606 B2                                      Page 1 of 1
APPLICATION NO.  : 10/855101
DATED            : February 7, 2006
INVENTOR(S)      : Alberto Bilotti et al.

It is certified that error appears in the above-identified patent and that said Letters Patent is hereby corrected as shown below:

Column 1, line 54 delete "uses of IGFET devices" and replace with --uses IGFET devices--.

Column 2, line 9 delete "IGFET device 12, 14" and replace with --IGFET devices 12, 14--.

Column 2, line 62 delete "is couple" and replace with --is coupled--.

Column 3, lines 44-45 delete "the present inventions," and replace with --the present invention,--.

Column 9, lines 27-28 delete "comprising" and replace with --comprising--.

Column 9, line 44 delete "bias voltage node and" and replace with --bias voltage and--.

This certificate supersedes certificate of correction issued August 15, 2006.

Signed and Sealed this

Nineteenth Day of September, 2006

JON W. DUDAS
*Director of the United States Patent and Trademark Office*